(12) United States Patent
Chakraborty et al.

(10) Patent No.: US 8,679,876 B2
(45) Date of Patent: Mar. 25, 2014

(54) LASER DIODE AND METHOD FOR FABRICATING SAME

(75) Inventors: Arpan Chakraborty, Goleta, CA (US); Monica Hansen, Santa Barbara, CA (US); Steven Denbaars, Goleta, CA (US); Shuji Nakamura, Santa Barbara, CA (US); George Brandes, Raleigh, NC (US)

(73) Assignee: Cree, Inc., Goleta, CA (US)

( * ) Notice: Subject to any disclaimer, the term of this patent is extended or adjusted under 35 U.S.C. 154(b) by 698 days.

(21) Appl. No.: 12/826,305

(22) Filed: Jun. 29, 2010

(65) Prior Publication Data

US 2010/0273281 A1 Oct. 28, 2010

Related U.S. Application Data

(62) Division of application No. 11/600,604, filed on Nov. 15, 2006, now Pat. No. 7,769,066.

(51) Int. Cl.
*H01L 21/00* (2006.01)

(52) U.S. Cl.
USPC ............. 438/31; 372/45.012; 372/43.01; 372/45.011

(58) Field of Classification Search
USPC ........................ 372/45.012; 438/31
See application file for complete search history.

(56) References Cited

U.S. PATENT DOCUMENTS

| | | | |
|---|---|---|---|
| 3,896,479 A | 7/1975 | Di Lorenzo | |
| 4,152,044 A | 5/1979 | Liu | |
| 4,675,575 A | 6/1987 | Smith et al. | |
| 5,477,436 A | 12/1995 | Bertling et al. | |
| 5,592,501 A | 1/1997 | Edmond et al. | ........ 372/45 |
| 5,612,567 A | 3/1997 | Baliga | |

(Continued)

FOREIGN PATENT DOCUMENTS

| | | |
|---|---|---|
| EP | 1189289 A1 | 3/1920 |
| EP | 1313187 A1 | 5/1921 |

(Continued)

OTHER PUBLICATIONS

M. Hansen et al., "Effect of AlGaN/GaN Strained Layer Superlattice Period on InGaN MQW Laser Diodes," phys. Stat. sol. (a) 176, (1999) pp. 59-62.*

(Continued)

*Primary Examiner* — Xinning Niu
(74) *Attorney, Agent, or Firm* — Koppel, Patrick, Heybl & Philpott

(57) ABSTRACT

A laser diode and method for fabricating same, wherein the laser diode generally comprises an InGaN compliance layer on a GaN n-type contact layer and an AlGaN/GaN n-type strained super lattice (SLS) on the compliance layer. An n-type GaN separate confinement heterostructure (SCH) is on said n-type SLS and an InGaN multiple quantum well (MQW) active region is on the n-type SCH. A GaN p-type SCH on the MQW active region, an AlGaN/GaN p-type SLS is on the p-type SCH, and a p-type GaN contact layer is on the p-type SLS. The compliance layer has an In percentage that reduces strain between the n-type contact layer and the n-type SLS compared to a laser diode without the compliance layer. Accordingly, the n-type SLS can be grown with an increased Al percentage to increase the index of refraction. This along with other features allows for reduced threshold current and voltage operation.

24 Claims, 4 Drawing Sheets

(56) References Cited

U.S. PATENT DOCUMENTS

| | | | |
|---|---|---|---|
| 5,705,321 A | 1/1998 | Brueck et al. | 430/316 |
| 5,812,576 A | 9/1998 | Bour | 372/45.01 |
| 5,838,706 A | 11/1998 | Edmond et al. | 372/45 |
| 6,046,464 A | 4/2000 | Schetzina | |
| 6,144,683 A | 11/2000 | Floyd | 372/50.12 |
| 6,172,382 B1 * | 1/2001 | Nagahama et al. | 257/94 |
| 6,330,111 B1 | 12/2001 | Myers | |
| 6,331,915 B1 | 12/2001 | Myers | |
| 6,372,536 B1 | 4/2002 | Fischer et al. | 438/46 |
| 6,504,179 B1 | 1/2003 | Ellens et al. | 257/88 |
| 6,521,915 B2 | 2/2003 | Odaki et al. | 257/98 |
| 6,611,003 B1 * | 8/2003 | Hatakoshi et al. | 257/98 |
| 6,657,393 B2 | 12/2003 | Natsume | |
| 6,693,357 B1 | 2/2004 | Borst et al. | 257/773 |
| 6,746,889 B1 | 6/2004 | Eliashevich et al. | |
| 6,765,242 B1 | 7/2004 | Chang et al. | 257/197 |
| 6,784,463 B2 | 8/2004 | Camras et al. | |
| 6,932,497 B1 | 8/2005 | Huang | |
| 7,087,936 B2 | 8/2006 | Negley | |
| 2002/0015013 A1 | 2/2002 | Ragle | |
| 2002/0054495 A1 | 5/2002 | Natsume | |
| 2003/0015708 A1 | 1/2003 | Parikh | |
| 2003/0085409 A1 | 5/2003 | Shen | |
| 2004/0057482 A1 * | 3/2004 | Wang | 372/45 |
| 2004/0207313 A1 | 10/2004 | Omoto et al. | |
| 2004/0233957 A1 | 11/2004 | Ito et al. | |
| 2004/0262576 A1 | 12/2004 | Thompson et al. | 252/301.16 |
| 2005/0030995 A1 * | 2/2005 | Kawakami et al. | 372/43 |
| 2005/0048766 A1 * | 3/2005 | Wu et al. | 438/629 |
| 2005/0077535 A1 | 4/2005 | Li | |
| 2005/0117320 A1 | 6/2005 | Leu et al. | |
| 2005/0152127 A1 | 7/2005 | Kamiya et al. | |
| 2005/0173692 A1 | 8/2005 | Park | |
| 2005/0173728 A1 | 8/2005 | Saxler | |
| 2005/0213625 A1 * | 9/2005 | Horie | 372/44.01 |
| 2005/0220046 A1 | 10/2005 | Yu et al. | |
| 2006/0081862 A1 | 4/2006 | Chua et al. | |
| 2006/0158899 A1 | 7/2006 | Avabe et al. | |
| 2006/0267031 A1 | 11/2006 | Tasch et al. | |
| 2007/0090383 A1 | 4/2007 | Ota | |
| 2007/0268694 A1 | 11/2007 | Bailey et al. | 362/231 |
| 2008/0023689 A1 | 1/2008 | Kim et al. | 257/13 |
| 2008/0036364 A1 | 2/2008 | Li et al. | |
| 2008/0074032 A1 | 3/2008 | Yano et al. | |
| 2010/0273281 A1 | 10/2010 | Chakraborty et al. | |
| 2011/0193057 A1 | 8/2011 | Sabathil et al. | |

FOREIGN PATENT DOCUMENTS

| | | |
|---|---|---|
| EP | 1063711 A1 | 12/1927 |
| EP | 0 272 985 A2 | 6/1988 |
| EP | 0881666 A2 | 12/1998 |
| EP | 0936382 | 8/1999 |
| EP | 1653255 | 5/2006 |
| EP | 1681509 | 7/2006 |
| EP | 2048718 | 4/2009 |
| FR | 2586844 | 3/1987 |
| FR | 2759188 | 8/1998 |
| FR | 2814220 | 3/2002 |
| JP | 11330552 | 11/1966 |
| JP | S63-288061 | 11/1988 |
| JP | H05-075101 | 3/1993 |
| JP | H05-283672 | 10/1993 |
| JP | 3191447 | 5/1994 |
| JP | 6268257 A | 9/1994 |
| JP | 7162038 A | 6/1995 |
| JP | 7176826 A | 7/1995 |
| JP | 8023124 A | 1/1996 |
| JP | 8070139 A | 3/1996 |
| JP | 8162671 A | 6/1996 |
| JP | 8274414 A | 10/1996 |
| JP | 9330630 A | 12/1996 |
| JP | 9148678 A | 6/1997 |
| JP | 9153642 A | 6/1997 |
| JP | 9162444 A | 6/1997 |
| JP | 11040850 | 7/1997 |
| JP | 9219556 A | 8/1997 |
| JP | 10012969 A | 1/1998 |
| JP | 10041581 A | 2/1998 |
| JP | 10065271 | 3/1998 |
| JP | 10145000 A | 5/1998 |
| JP | 10145002 A | 5/1998 |
| JP | 10033557 A | 12/1998 |
| JP | 11074562 A | 3/1999 |
| JP | 11186659 A | 7/1999 |
| JP | 11191638 A | 7/1999 |
| JP | 11224972 A | 8/1999 |
| JP | 11238945 A | 8/1999 |
| JP | 11251684 A | 9/1999 |
| JP | 11298090 A | 10/1999 |
| JP | 2000-049363 | 2/2000 |
| JP | 20000685 A | 3/2000 |
| JP | 2000-150920 | 5/2000 |
| JP | 2000133883 A | 5/2000 |
| JP | 2000150956 A | 5/2000 |
| JP | 2000244072 A | 9/2000 |
| JP | 2000307149 A | 11/2000 |
| JP | 2001168471 | 6/2001 |
| JP | 2001332770 A | 11/2001 |
| JP | 2002512379 | 4/2002 |
| JP | 2002543594 | 12/2002 |
| JP | 2002543594 A | 12/2002 |
| JP | 2003-59938 | 2/2003 |
| JP | 2003-152219 | 5/2003 |
| JP | 2003258313 A | 9/2003 |
| JP | 2003318449 A | 11/2003 |
| JP | 2004276383 | 10/2004 |
| JP | 2004281605 | 10/2004 |
| JP | 2005228833 | 8/2005 |
| JP | 2007-036010 | 2/2007 |
| JP | 2007-189239 | 7/2007 |
| JP | 2007189239 | 7/2007 |
| JP | 2009094517 | 4/2009 |
| WO | WO 9831055 A1 | 7/1998 |
| WO | WO 98/37585 A1 | 8/1998 |
| WO | WO9856043 | 12/1998 |
| WO | WO 9905728 A1 | 2/1999 |
| WO | WO 9946822 A1 | 9/1999 |
| WO | WO 0021143 | 4/2000 |
| WO | WO 0076004 A1 | 12/2000 |
| WO | WO 01-41224 | 6/2001 |
| WO | WO 02-01608 | 1/2002 |
| WO | WO 0205399 A1 | 1/2002 |
| WO | WO 02/11212 A | 2/2002 |
| WO | 03044870 | 5/2003 |
| WO | WO03080763 | 10/2003 |
| WO | WO2004084316 | 9/2004 |
| WO | WO2004084316 A2 | 9/2004 |
| WO | WO2004109813 | 12/2004 |
| WO | WO2004109813 A2 | 12/2004 |
| WO | WO2005104247 | 3/2005 |
| WO | WO 2005/098976 A | 10/2005 |
| WO | WO2005098976 A2 | 10/2005 |
| WO | WO2005119799 | 12/2005 |
| WO | 2007005844 A2 | 1/2007 |
| WO | WO2007075815 | 7/2007 |
| WO | WO 2008/020913 | 2/2008 |
| WO | WO2008020913 | 2/2008 |

OTHER PUBLICATIONS

"The American Heritage Dictionary", Library of Congress, New College Ed., 1976, pp. 867.

"Properties of Delta Doped A10.25Ga0.75N and GaN Epitaxial Layers", Jeffrey S. Flynn, et al, Materials Research Society, 1 page.

"III-nitride ultraviolet light-emitting diodes with delta doping", K.H. Kim. et al. Applied Physics Letters, vol. 83, No. 3. Jul. 21, 2003, pp. 566-568.

Reduction of threading edge dislocation density in n-type GaN by Si delta-doping, Y.B. Pan. et al, Journal of Crystal Growth 286 (2006) 255-258.

(56) References Cited

OTHER PUBLICATIONS

Epitaxial Growth and Characterisation of Silicon Delta-Doped GaAs, AlAs and AlxGa1-xAs, B. Sciana, et al, Crystal Res. Technol. 36 2001 8-10, pp. 1145-1154.
"Effects of periodic delta-doping on the properties of GaN:Si films grown on Si (111) substrates" L.S. Wang, et al, Applied Physics Letters. vol. 85, No. 34, Dec. 13, 2004. pp. 5881-5884.
"The effect of periodic silane burst on the properties of GaN on Si (111) substrates", Zang Keyan, et al, Singapore-MIT Alliance. E4-04-10 & Dept. of Materials Science and Engineering 4 pages.
European Search Report. EP 03 07 8515, dated: Feb. 2, 2004.
Partial European Search Report, EP 09 15 7557. dated: May 28, 2009.
Non-final Rejection. Korean Appl. No. 10-2003-7012710, dated: Aug. 8, 2008.
Non-final Rejection. Korean Appl. No. 10-2008-7026427. dated: Jan. 23, 2009.
Office Action from U.S. Appl. No. 11/900,952, dated: Nov. 17, 2011.
Response to Office Action from U.S. Appl. No. 11/900,952, filed Mar. 19, 2012.
Office Action from U.S. Appl. No. 11/974,431, dated: Nov. 29, 2011.
Summary of Decision of Rejection from Japanese Patent Application No. 2008-262602, dated May 8, 2012.
Notice of Reasons for Rejection for Japanese Patent Application No. JP 2007-143451 dated May 10, 2011.
Extended Search Report for European Patent Application No. 11154411.0 dated May 30, 2011.
Singh Madhusudan, et al., "Examination of Tunnel Junctions in the AlGaN/GaN System: Consequences of Polarization Charge", Applied Physics Letters, AIP, American Institute of Physics, Melville, NY, vol. 77, No. 12, Sep. 18, 2000, pp. 1867-1969.
Panda A.K. et al., "DC and High-Frequency Characteristics of GaN Based Impatts", IEEE Transactions on Electron Devices, IEEE Service Center, Pisacataway, NJ, US vol. 48, No. 4, Apr. 1, 2001, pp. 820-823.
Decision of Rejection and Decision of Dismissal of Amendment from Japanese Patent Application No. 2007-143451, dated Nov. 13, 2012.
First Notice of Office Action, dated: May 8, 2009, for Chinese Application No. 200710142217.6, pp. 1-3.
Office Action from U.S. Appl. No. 11/600,617, dated Dec. 22, 2009.
Office Action for U.S. Appl. No. 11/600,604, dated: May 14, 2008.
Response to Office Action filed on Sep. 15, 2008 for U.S. Appl. No. 11/600,604.
Response to Office Action filed on Nov. 24, 2008 for U.S. Appl. No. 11/600,604.
Office Action for U.S. Appl. No. 11/600,604, dated: Feb. 11, 2009.
Office Action for U.S. Appl. No. 11/600,604, dated: May 12, 2009.
Response to Office Action filed on Apr. 13, 2009 for U.S. Appl. No. 11/600,604.
Response to Office Action filed on Jun. 11, 2009 for U.S. Appl. No. 11/600,604.
Response to Office Action filed on Jun. 30, 2009 for U.S. Appl. No. 11/600,604.
Office Action for U.S. Appl. No. 11/600,604, dated: Sep. 16, 2009.
Response to Office Action filed on Dec. 11, 2009 for U.S. Appl. No. 11/600,604.
Notice of Allowance for U.S. Appl. No. 11/600,604, dated: Mar. 23, 2010.
International Search Report for PCT/US2008/004453, Date: Sep. 9, 2008.
Written Opinion for PCT/US2008/004453, Date: Sep. 9, 2008.
Kim J K et al. "Strongly Enhanced Phosphor Efficiency in GaInN White Light-Emitting Diodes Using Remote Phosphor Configuration and Diffuse Reflector Cup", Japanese Journal of Applied Physics, Japan Society of Applied Physics, Tokyo, JP, vol. 44, No. 20-23, Jan. 1, 2005, XP-001236966.
The Second Office Action from People's Republic of China, re: China Application No. 200480027969.2, Date: Jul. 4, 2008.
Notice of First Office Action from related China Patent Application No. 200710142217.6, dated: Jun. 22, 2009.
Official Communication from the EPO regarding European Application 08253301.9, dated: Nov. 17, 2009.
Second Office Action from Chinese Application No. 200710142217.6, dated: Nov. 6, 2009.
Notice Requesting Submission of Opinion re related Korean application No. 10-2004-7001033, dated: Mar. 9, 2009.
Zhang et al. "Comparison of GaN P-I-N and Schottky Rectifier Performance", IEEE Transactions on Electron Devices, vol. 48, No. 3, Mar. 2001, pp. 407-411.
Sakai et al., "Experimental Investigation of Dependence of Electrical Characteristics on Device Parameters in Trench MOS Barrier Schottky Diodes", 1998, International Symposium on Power Semiconductor Devices & ICs, Kyoto, pp. 293-296.
European Search Report re related European Application No. 08253301.9-2222. Feb. 24, 2009.
European Search Report re related EP Appl. 08160129.6.2222, Dated: Dec. 15, 2008.
Copending U.S. Appl. No. 11/443,741, filed Jun. 14, 2007.
Copending U.S. Appl. No. 11/685,761, filed Mar. 13, 2007.
Copending U.S. Appl. No. 11/939,059, filed Nov. 13, 2007.
Asbeck et al."Enhancement of Base Conductivity Via the Piezoelectric Effect in AlGaN/GaN HBTs", Solid State Electronics, Elsevier Science Pub. Barking GB, vol. 44, No. 2, Feb. 1, 2000 pp. 211-219, XP004186190.
Johnson et al."New UV Light Emitter Based on AlGaN Heterostructures with Graded Electron and Hole Injectors", Materials Research Society Symposium—Proceedings 2002 Materials Research Society US, vol. 743, 2002, pp. 481-486.
Simon et al. "Polarization-Induced 3-Dimensional Electron Slabs in Graded AlGaN Layers", Materials Research Society Symposium Proceedings 2006 Materials Research Society US, vol. 892, Nov. 28, 2005, pp. 417-422.
Official Notice of Final Decision of Rejection Japanese Patent Appl. No. 2003-529535, Dated: Jan. 6, 2009.
European Communication from European Appl. 02 798 906.0-1235, Dated Feb. 6, 2009.
PCT Search Report and Written Opinion PCT/US2007/086237, date: May 8, 2008 in related application.
PCT Search Report and Written Opinion PCT/US2007/12403, Date: Aug. 6, 2008.
PCT Search Report and Written Opinion PCT/US2007/086242, Date: Mar. 4, 2008.
U.S. Appl. No. 11/613,692, filed Dec. 20, 2006.
U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,982, filed May 22, 2007.
U.S. Appl. No. 11/753,103, filed May 24, 2007.
U.S. Appl. No. 11/751,990, filed May 22, 2007.
U.S. Appl. No. 11/755,153, filed May 30, 2007.
U.S. Appl. No. 11/856,421, filed Sep. 17, 2007.
U.S. Appl. No. 11/859,048, filed Sep. 21, 2007.
U.S. Appl. No. 11/939,047, filed Nov. 13, 2007.
U.S. Appl. No. 11/936,163, filed Nov. 7, 2007.
U.S. Appl. No. 11/843,243, filed Aug. 22, 2007.
U.S. Appl. No. 11/939,052, filed Nov. 13, 2007.
U.S. Appl. No. 11/736,799, filed Apr. 18, 2007.
U.S. Appl. No. 11/877,038, filed Oct. 23, 2007.
U.S. Appl. No. 11/870,679, filed Oct. 11, 2007.
U.S. Appl. No. 11/948,041, filed Nov. 30, 2007.
U.S. Appl. No. 11/949,222, filed Dec. 3, 2007.
U.S. Appl. No. 12/174,053, filed Jul. 16, 2008.
U.S. Appl. No. 12/002,429, filed Dec. 4, 2007.
U.S. Appl. No. 12/045,729, filed Mar. 11, 2008.
U.S. Appl. No. 11/818,818, filed Jun. 14, 2007.
Examination of European Patent Application No. 08 253 301.9-2222, dated Apr. 24, 2012.
Decision for Grant for Japanese Patent Application No. 2008-182592, dated Jul. 3, 2012.
Notice of Reasons for Rejection for Japanese Patent Application No. 2007-143451, dated Jul. 31, 2012.

(56) References Cited

OTHER PUBLICATIONS

Notification of National Application Upon the Preliminary Examination of Patent Application from Chinese Patent Application No. 200880100370.5 dated Jun. 1, 2010.
Notification on Publication and Entry into Procedure of Substantive Examination of Invention Patent Application from Chinese Patent Application No. 200880100370.5 dated Aug. 18, 2010.
Office Action from U.S. Appl. No. 11/900,952, Dated: May 26, 2011.
Office Action from U.S. Appl. No. 13/045,246, Dated: Oct. 21, 2011.
Invitation to Submit Applicant's Opinion (Summary) in Japanese Appeal Filing No. 2009-007421, Japanese Patent Application No. 2003-529535 mailed Dec. 7, 2010.
Examiner's Report to the Board (Summary) in Japanese Appeal Filing No. 2009-007421, Japanese Patent Application No. 2003-529535 mailed Dec. 7, 2010.
Summary of Notice of Reasons for Rejection for Japanese Patent Application No. 2008-264568 mailed Nov. 15, 2011.
Summary of Notice of Reasons for Rejection for Japanese Patent Application No. 2008-182592 mailed Nov. 22, 2011.
M.A.L. Johnson, et al., New UV Light Emitter Based on AlGaN Heterostructures with Graded Electron and Hole Injectors, Mat. Res. Soc. Symp. Proc. vol. 743, 2003, pp. 481-486.
Simon, John, et al., Polarization-Induced 3-Dimension Electron Slabs in Graded AlGaN Layers, Material Res. Soc. Symp. vol. 892, 2006, pp. 417-422.
Summary of Notice of Reasons for Rejection for Japanese Patent Application No. JP 2007-292302 mailed Jan. 24, 2012.
Examination Report for European Patent Application No. 07254498.4 dated Jan. 26, 2012.
Appeal Board's Questioning from Japanese Patent Application No. 2008-262602, dated Dec. 14, 2012.
Office Action from U.S. Appl. No. 12/905,374, dated: Mar. 27, 2012.
Office Action from U.S. Appl. No. 13/045,246, dated: Apr. 5, 2012.
Official Action from European Patent Appl. No. 11154411.0. dated Feb. 27, 2013.
Decision of Patent Grant from Japanese Patent Application No. 2007-143451, dated Apr. 16, 2013.
Summary of Notice of Reasons for Rejection for Japanese Patent Application No. 2008-262602 mailed Jul. 12, 2011.
Office Action for Canadian Patent Application No. 2,454,310 dated Aug. 30, 2011.
Summary of Notice of Reasons for Rejection for Japanese Patent Application No. 2007-292302 dated Oct. 4, 2011.
Examination Report from Canadian Patent Appl. No. 2,454,310, dated Sep. 5. 2013.
Hanson, et al., "Effect of AlGaN/GaN Strained Layer Superlattice Period on InGaN MQW Laser Diodes", phys. Stat. sol. (a) 176, 59 (1999), Materials and Electrical and Computer Engineering Departments University of California, Santa Barbara, CA 93106-5050.
Examination Report from European Patent Appl. No. 07 254 498.1, dated Aug. 9. 2013.
Decision of Appeal from Japanese Patent Appl. No. 2008-262602. dated Jul. 5, 2013.
Office Action from U.S. Appl. No. 11/974,431. dated May 22, 2013.
Response to OA from U.S. Appl. No. 11/974,431, filed Jul. 23, 2013.
Office Action from U.S. Appl. No. 11/900,952. dated May 14, 2012.
Response to OA from U.S. Appl. No. 11/900,952, filed Sep. 14, 2012.
Office Action from U.S. Appl. No. 11/900,952. dated Nov. 17, 2011.
Response to OA from U.S. Appl. No. 11/900,952, filed Mar. 19, 2012.
Office Action from U.S. Appl. No. 11/974,431. dated Nov. 29, 2011.
Response to OA from U.S. Appl. No. 11/974,431. filed May 29, 2012.
Office Action from U.S. Appl. No. 11/974,431. dated Jul. 9, 2012.
Response to OA from U.S. Appl. No. 11/974,431, filed Sep. 26, 2012.
Office Action from U.S. Appl. No. 13/045,246. dated Apr. 5, 2012.
Response to OA from U.S. Appl. No. 13/045,246, filed Jul. 2, 2012.
Office Action from U.S. Appl. No. 11/974,431. dated Feb. 14, 2013.
Response to OA from U.S. Appl. No. 11/974,431, filed May 14, 2013.
Office Action from U.S. Appl. No. 13/045,246. dated Dec. 5, 2012.
Response to OA from U.S. Appl. No. 13/045,246, filed Feb. 21, 2013.
Office Action from U.S. Appl. No. 11/900,952. dated Jan. 15, 2013.
Response to OA from U.S. Appl. No. 11/900,952, filed Apr. 9, 2013.
Office Action from U.S. Appl. No. 13/045,246. dated Aug. 28, 2012.
Response to OA from U.S. Appl. No. 13/045,246, filed Oct. 16, 2012.
Office Action from U.S. Appl. No. 12/905,374. dated Mar. 27, 2012.
Response to OA from U.S. Appl. No. 12/905,374, filed Jun. 27, 2012.

\* cited by examiner

LASER DIODE AND METHOD FOR FABRICATING SAME

This application is a divisional application from, and claims the benefit of, U.S. patent application Ser. No. 11/600,604 filed Nov. 15, 2006 now U.S. Pat. No. 7,769,066 to Chakrabory et al., also entitled "Laser Diode and Method for Fabricating Same."

BACKGROUND OF THE INVENTION

1. Field of the Invention

This invention relates to laser diodes, and more particularly to nitride based semiconductor laser diodes and methods for fabricating same.

2. Description of the Related Art

A laser is a device that produces a beam of coherent light as a result of stimulated emission. Light beams produced by lasers can have high energy because of their single wavelength, frequency, and coherence. A number of materials are capable of producing a lasing effect and include certain high-purity crystals (such as ruby), semiconductors, certain types of glass, certain gasses including carbon dioxide, helium, argon and neon, and certain plasmas.

More recently there has been increased interest in lasers made of semiconductor materials. These devices typically have a smaller size, lower cost, and have other related advantages typically associated with semiconductor devices. Semiconductor lasers are similar to other lasers in that the emitted radiation has spacial and temporal coherence, and like other lasers, semiconductor lasers produce a beam of light that is highly monochromatic (i.e. of narrow bandwidth) and is highly directional. Overall, semiconductor lasers provide very efficient systems that are easily modulated by modulating the current directed across the devices. Additionally, because semiconductor lasers have very short photon lifetimes, they can be used to produce high-frequency modulation.

One type of semiconductor laser diode is referred to as an edge emitting laser where the stimulated emission is from the side surface or edge of the laser diode. These devices typically have epitaxial layers in the form of waveguiding or reflective elements (cladding layers) with a light generating active region between the reflective elements. Additional layers can be included between the reflective elements to form a laser cavity. The edges of the laser diode can be cleaved during manufacturing to form edge reflective surfaces. A total reflectivity (TR) material can cover one edge, and an anti reflectivity (AR) material can cover the opposite edge. Light from the active region is reflected between the edges and within the cavity by the reflective elements, with stimulated emission emitting from the edge with the AB material.

A known characteristic of laser diodes (and light emitting diodes) is that the frequency of radiation that can be produced by the particular laser diode is related to the bandgap of the particular semiconductor material. Smaller bandgaps produce lower energy, shorter wavelength photons, while wider bandgaps produce higher energy, shorter wavelength photons. One semiconductor material commonly used for lasers is indium gallium aluminum phosphide (InGaAlP), which has a bandgap that is generally dependant upon the mole of atomic fraction of each element present. This material, regardless of the different element atomic fraction, produces only light in the red portion of the visible spectrum, i.e., about 600 to 700 nanometers (nm).

Laser diodes that produce shorter wavelengths not only produce different colors of radiation, but offer other advantages. For example, laser diodes, and in particular edge emitting laser diodes, can be used with optical storage and memory devices (e.g. compact disks (CD) digital video disks (DVD), high definition (HD) DVDs, and Blue Ray DVDs). Their shorter wavelength enables the storage and memory devices to hold proportionally more information. For example, an optical storage device storing information using blue light can hold approximately 32 times the amount of information as one using red light, using the same storage space. There are also applications for shorter wavelength laser in medical systems and projection displays. This has generated interest in Group-III nitride material for use in laser diodes, and in particular gallium nitride (GaN). GaN can produce light in the blue and ultra violet (UV) frequency spectrums because of its relatively high bandgap (3.36 eV at room temperature). This interest has resulted in developments related to the structure and fabrication of Group-III nitride based laser diodes [For example see U.S. Pat. Nos. 5,592,501 and 5,838,786 to Edmond et al].

Group-III nitride laser diodes can require relatively high threshold currents and voltages to reach laser radiation because of optical and electrical inefficiencies. These elevated current and voltage levels can result in heat being generated during laser diode operation. In certain applications, laser diodes are driven by a pulsed signal that results in pulsed laser light being emitted from the laser diode. The heat generated within the laser diode typically does not present a problem during pulsed laser diode operation because the laser diode has the opportunity to cool during the lows of the signal. For other important applications, however, it can be desirable to drive the laser diode with a continuous wave (CW). CW operation is particularly applicable to operation with optical storage devices that can require a continuous light source for data storage and retrieval. Driving many current Group-III based laser diodes with a CW having the threshold current and voltage necessary for laser emission can result in heating that can damage or destroy the laser diode. Heat sinks or other cooling methods/devices can be employed to reduce operating heat within these laser diodes, but the methods/devices can increase the cost and complexity of the devices and can require additional space.

SUMMARY OF THE INVENTION

The present invention is generally directed to laser diode epitaxial structure having improved operating characteristics and improved reliability, and methods for fabricating the epitaxial structures. The improved operating characteristics include operation as reduced current and voltage thresholds, which allow for efficient operation at reduced temperature.

One embodiment of a laser diode according to the present invention comprises an active region sandwiched between first and second waveguiding elements, and a compliance layer. The first waveguiding element is on the compliance layer with the compliance layer reducing strain between the first waveguiding element and other laser diode layers. The first waveguiding element has a higher index of refraction than a first waveguiding element in a similar laser diode without the compliance layer.

One embodiment of a Group-III nitride laser diode according to the present invention comprises an InGaN compliance layer on a GaN n-type contact layer and an AlGaN/GaN n-type strained super lattice (SLS) on said compliance layer. An n-type GaN separate confinement heterostructure (SCH) is on said n-type SLS and an InGaN multiple quantum well (MQW) active region is on the n-type SCH. A GaN p-type SCH on the MQW active region, an AlGaN/GaN p-type SLS is on the p-type SCH, and a p-type GaN contact layer is on the p-type SLS. The compliance layer has an In percentage that reduces strain between the n-type contact layer and the n-type SLS compared to a laser diode without the compliance layer.

One embodiment of a method according to the present invention for fabricating a Group-III nitride laser diode comprises growing an n-type contact layer on a substrate at a temperature within a first growth temperature range. An n-type compliance layer is grown on said n-type contact layer at a temperature within a second growth temperature range that is lower than said first growth temperature. An n-type waveguiding element is grown on said compliance layer at a temperature within said first growth temperature range, said waveguiding element grown with a higher index of refraction compared to laser diodes without said compliance layer. An n-type separate confinement heterostructure (SCH) on said n-type waveguiding element, an active region is grown on said n-type SCH, a p-type SCH is grown on said active region, and a p-type waveguiding element is grown on said p-type SCH.

These and other further features and advantages of the invention will be apparent to those skilled in the art from the following detailed description, taken together with the accompanying drawings.

DETAILED DESCRIPTION OF THE INVENTION

Figure 3:
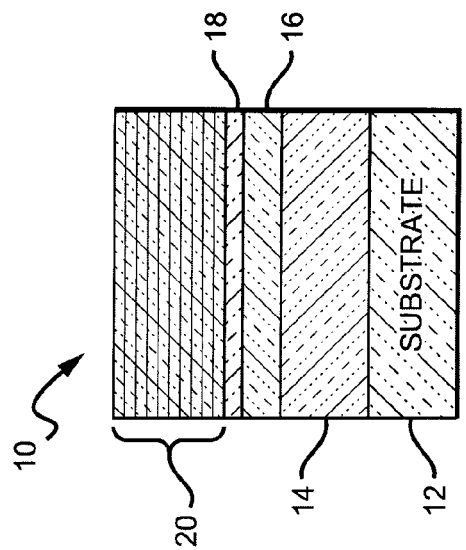
FIG. 3 is a sectional view of the laser diode in FIG. 2 with a strained-layer supperlattice (SLS) on the cap layer.

The present invention provides high reliability, high output power nitride-based laser diode characterized by reduced threshold current densities and reduced threshold voltages. The present invention is particularly applicable to continuous wave operation laser diodes, although it can also be used in pulsed wave operation laser diodes. The reduced current and voltage thresholds result in lower heat build-up in the laser diode during operation, which in turn reduces that likelihood of damage or destruction of the device due to overheating.

The present invention is also directed to methods for fabricating laser diodes with these characteristics, and although the present invention is generally directed to nitride-based laser diodes it is understood that it can also be applied to laser diodes made of other material systems.

The improved threshold and current characteristics result in the laser diode operating at lower temperature without the need for external heat management elements, such as heat sinks. The improved laser diodes according to the present invention can operate at many different threshold currents and voltages, with preferred laser diodes operating with a threshold current of less than 5 kA/cm$^2$ and threshold voltage less than 5 volts (V). One embodiment of a laser diode according to the present invention has threshold current in the range of 2-4 kA/cm$^2$ and threshold voltage in the range of 4-5V, providing an output power of at least 25 mW. These lower threshold voltages and currents are a factor in lowering the laser diode's operating temperature.

The improved threshold current and voltage characteristics are realized by improving the waveguiding within the laser diode, such as by improving the guiding efficiency of the waveguiding elements. Each of the waveguiding elements can comprise waveguide cladding layers in the form of strained-layer superlattice (SLS). By increasing the index of refraction of the layers, guiding efficiency can be improved and less loss is experienced as light from the laser diode's active region is guided by the waveguiding elements. With less loss, stimulated emission can be achieved with lower threshold currents and voltages.

In one embodiment according to the present invention, the laser diode is made from the Group-III nitride material system and in particular is made from aluminum gallium nitride and gallium nitride material (AlGaN/GaN). As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. As well understood by those in this art, the Group III elements can combine with nitrogen to form binary (e.g., GaN), ternary (e.g., AlGaN and AlInN), and quaternary (e.g., AlInGaN) compounds. These compounds all have empirical formulas in which one mole of nitrogen is combined with a total of one mole of the Group III elements. Accordingly, formulas such as $Al_xGa_{1-x}N$, where $0 \leq x \leq 1$, are often used to describe them. In Group-III nitride laser diodes, the index of refraction of at least one of the waveguide elements is increased by arranging the laser diode so that aluminum (Al) mole fraction in the waveguiding element is increased.

In one embodiment according to the present invention, the waveguide elements can be fabricated with high Al content waveguide elements by employing a compliance layer to provide strain relief. Without this strain relief there is a danger of cracking and other forms of degradation when growing high Al content Group-III nitride (AlGaN/GaN) waveguiding elements. Different compliance layers can be used with one embodiment according to the present invention comprising a low temperature (LT) high indium (In) containing indium gallium nitride (InGaN) compliance layer, with an In percentage between 8 and 15 percent (%). Because of the reduced strain with other device layers as a result of the compliance layer, the waveguide cladding layers can have an Al content in the range of 15 to 20%, although other AL percentages can also be used. The higher AL content results in a larger difference in index of refraction with the active region which allows for the waveguide cladding layers to provide improved waveguiding.

Laser diodes according to the present invention can also have other improvements to allow for improved operating characteristics. Some of these include having the quantum well interface roughness reduced by adopting slower growth rate for the device n-type separate confinement heterostructure (SCH). Accordingly, the n-type SCH layer provides a smooth and uniform epitaxial layer upon which the quantum well active region can be formed. The p-contact resistance, and as result the threshold voltage, can also be reduced by employing a thicker and heavily doped p-type GaN cap layer and by reducing the doping level of the layers in the n-type SLS structure. Laser diodes according to the present invention can also comprise a high temperature (HT) growth p-type SCH layer and a low temperature (LT) growth p-SLS layer. The p-type SCH is grown at high temperature to assist Mg diffusion back into the p-AlGaN cap.

The present invention is described herein with reference to certain embodiments but it is understood that the invention can be embodied in many different forms and should not be construed as limited to the embodiments set forth herein. It is also understood that when an element or component is referred to as being "on", "connected to" or "coupled to" another layer, element or component, it can be directly on, connected to or coupled to the other layer element or component, or intervening elements may also be present. Furthermore, relative terms such as "inner", "outer", "upper", "above", "lower", "beneath", and "below", and similar terms, may be used herein to describe a relationship of one component or element to another. It is understood that these terms are intended to encompass different orientations of the device in addition to the orientation depicted in the figures.

Although the terms first, second, etc. may be used herein to describe various layers, elements, components and/or sections, these layers, elements, components, and/or sections should not be limited by these terms. These terms are only used to distinguish one layer, element, component, or section from another. Thus, a first layer, element, component, or section discussed below could be termed a second element, component, or section without departing from the teachings of the present invention.

Embodiments of the invention are described herein with reference to cross-sectional view illustrations that are schematic illustrations of idealized embodiments of the invention. It is understood that many of the layers will have different relative thicknesses compared to those shown and that the laser diodes will have different shapes. Further, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Referring now to the drawings and in particular FIGS. 1-9, a laser diode 10 according to the present invention is shown at different steps in the fabrication process. A single laser diode 10 is shown, but it is understood that more typically many laser diodes are fabricated on a single substrate wafer, with the devices then being separated into individual devices using known processes, such as scribe and break processes.

Laser diodes can be formed on a substrate wafer using known fabrication processes such as growth in a reactor by metalorganic chemical vapor deposition (MOCVD). Under some circumstances carbon can form in the semiconductor material comprising the laser diode that can interfere with light output. To minimize carbon formation, the laser diode structure can be grown at high pressure within the MOCVD reactor, such as at atmospheric pressure. Carbon build-up can also be minimized by using a high V/III ammonia ratio during growth, and by using a slower growth rate. Many different precursors can be used during MOCVD growth including but not limited to trimethylgallium (TMGa), tiethylgallium (TEGa), trimethylaliminum (TMAl), tiemethylindium (TMIn), Bis(cyclopentadieny)Magnesium ($Cp_2Mg$), silane ($SiH_4$) and ammonia ($NH_3$).

Figure 1:
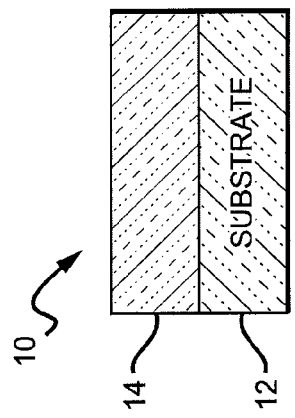
FIG. 1 is sectional view of one embodiment of a laser diode according to the present invention at fabrication step where it has a contact layer on a substrate.

FIG. 1 shows one embodiment the laser diode 10 at an early step in the fabrication process comprising a substrate 12 that can be made of many different materials including but not limited to sapphire, silicon carbide, with the preferred laser diode 10 being formed on a free-standing GaN substrate or a lateral epitaxial overgrown (LEO) GaN template. N-type contact layer 14 is grown on the substrate 12 that comprises a material suitable for spreading current from an n-contact to the active region. For laser diodes that are formed on conductive substrates, the n-contact can be formed on the substrate 12 and current conducts through the substrate to the active region of the laser diode 10. For laser diodes formed on non-conductive substrates or substrates that do not efficiently spread current, a lateral geometry can be used for contacting the device. As further described below for lateral geometry, the laser diode 10 can be etched to form a mesa in the contact layer 14 and the n-contact is deposited on the contact layer mesa. Current spreads from the contact, through the n-type layer 14 and to the laser diode's active region.

It is also understood that laser diodes formed on a conductive substrate can effectively spread current without the n-type contact layer 14, and that these embodiments can be arranged without the contact layer 14. It is further understood that other embodiments of the present invention can have the substrate removed, and in those embodiments contact can be made directly to the epitaxial layers.

The n-type contact layer 14 can be made of many different elements/materials doped with different elements in different densities. The preferred contact layer 14 comprises GaN doped with silicon (Si) having a doping density being between 1E17 to 1E19 $cm^{-3}$. The contact layer 14 is normally grown at high temperature (e.g. 1000 to 1100° C.) and the preferred growth rate is 1.5 to 3 μm/hr. The preferred MOCVD growth carrier gas is hydrogen with a 50% $H_2$/50% $N_2$ subflow.

Figure 2:
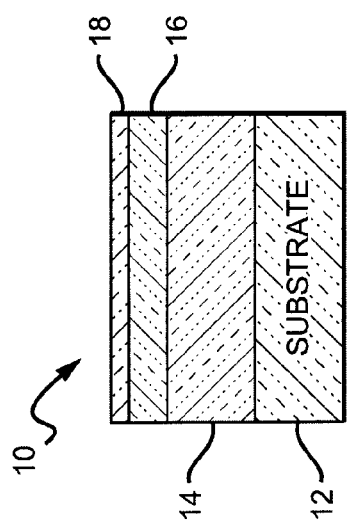
FIG. 2 is a sectional view of the laser diode in FIG. 1, with compliance layer and cap layer on the contact layer.

FIG. 2 shows the laser diode 10 after additional growth steps to form a compliance layer 16 on the contact layer 14. The compliance layer is included to allow waveguiding elements to be grown with higher index of refraction, which in turn allows for the threshold current of laser operation to be lower. As described below, the waveguiding elements of some embodiments of the laser diode according to the present invention comprise waveguiding epitaxial layers that can be arranged in many different ways and can comprise many different structures. In one embodiment according to the present invention, the waveguiding epitaxial layers comprise a strained layer superlattice (SLS) made of AlGaN/GaN. The higher the Al content of the SLS the higher the index of refraction and the more efficient the guiding of active region light. Without the compliance layer, however, a good quality SLS may not be reliably formed. The strain between the contact layer 14 and the SLS structure could cause the high Al content layers to degrade or crack.

To reduce the danger of degradation and cracking, the compliance layer 16 includes one or more elements that help reduce the strain between the contact layer 14 and SLS. In the one embodiment according to the present invention, the compliance layer 16 can comprise n-type $In_xGa_{1-x}N$ layer grown by with Si doping. The In element in the compliance layer provides for the strain relief, with the desirable In composition (x) being between 0.08 and 0.12. It is understood that other compositions of (x) are also acceptable such as 0 to 0.08 and 0.12 to 0.20 or more. Many different Si doping densities can also be used with a suitable doping density being between 1E17 to 1E19 $cm^{-3}$. The preferred MOCVD growth carrier gas is nitrogen which assists in higher In incorporation, and the subflow can be 100% $N_2$.

Because of the In element in the compliance layer, however, the compliance layer is typically grown at temperatures lower than the growth temperature of typical AlGaN/GaN layers. This lower temperature growth encourages In incorporation into the material. Typical growth temperatures for InGaN are in the range of 700 to 1000° C. A, with a suitable growth temperature being 900° C. Subsequent device layers of AlGaN/GaN can be grown at temperatures in the range of 1050-1100° C. These elevated temperatures present a danger of desorption or burning of the In within the compliance layer 16, that can negatively impact the operation and efficiency of the laser diode 10. To help reduce the danger, a thin low-temperature (LT) n-type GaN:Si first cap layer 18 can be grown on the compliance layer to cap and protect the InGaN compliance layer 16. Growth of GaN at 900° C. is relatively slow but can be used because the cap layer is relatively thin. Growth at this temperature also provides the advantage of not significantly damaging or degrading the In in the InGaN compliance layer. The cap layer 18 protects the InGaN compliance layer 16 during the temperature ramp-up for faster growth of subsequent layers.

FIG. 3 shows the laser diode 10 after additional growth steps, with an n-type SLS 20 formed on the cap layer 18 and compliance layer 16, with the cap layer 18 between the compliance layer 16 and the n-type SLS 20. The n-type SLS 20 can comprise different layers made of many different materials, with a preferred SLS being an n-type $Al_xGa_{1-x}N$/GaN:Si modulation-doped SLS. The SLS is preferably grown by Si-doping the GaN layer(s) only. The preferred thickness of the AlGaN and GaN:Si layers is between 2-3 nm and the desirable growth rate is between 0.5-2 A/s, which encourages Al incorporation at high pressure during growth of the AlGaN layers. The preferred growth carrier gas is hydrogen with 50% $H_2$/50% $N_2$ subflow and high growth temperature is normally desired (e.g. approximately 1050° C.). The doping density of the GaN layer(s) is between 1E17 to 1E19 $cm^{-3}$ and the most desirable As discussed above, the compliance layer 16 allows for reliably growth of the n-type SLS 20 with a higher Al composition than could be grown without the presence of the compliance layer. The higher Al content allows the n-type SLS 20 to more efficiently reflect light emitted by the laser diode's active region. The $Al_xGa_{1-x}N$ layer(s) of the n-type SLS 20 preferably have an (x) composition between 0.15 and 0.2. Composition (x) in the ranges of 0.1 to 0.15 and 0.2 to 0.3, as well as other compositions are also acceptable. Higher Al compositions, however, can result in lower conductivity due to the increase in the ionization energy of the Si dopant. Lower Al compositions can result in poor wave-guiding because of reduced refractive-index of the SLS 20. The SLS 20 can have many different thicknesses, with a preferred thickness being between 0.6 to 1.5 μm.

Figure 4:
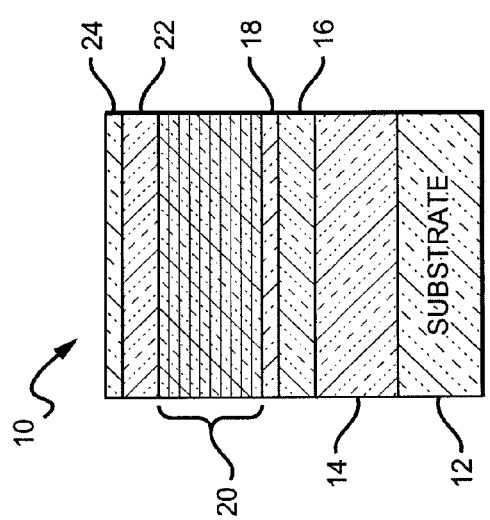
FIG. 4 is a sectional view of the laser diode in FIG. 3 with a separate confinement heterostructure (SCH) layer on the SLS and an undoped layer on the SCH layer.

FIG. 4 shows the laser diode 10 with an n-type separate confinement heterostructure (SCH) layer 22 formed on the SLS 20. The SCH layer 22 serves as part of the light path to the edges of the laser diode 10 and ultimately out the emission edge of the laser diode 10. The light from the active region traveling toward the waveguiding elements (n-type SLS 20 and the p-type SLS described below) is reflected, and light traveling toward the laser diode's edges is reflected until stimulated emission is out one of the edges. The n-type SCH layer 22 and p-type SCH layer serve as the primary reflection cavity for this reflected light.

SCH 22 can comprise many different materials doped in different densities by different elements. A preferred n-type SCH comprises an n-type GaN grown with Si doping at a doping density between 1E17 to 1E18 $cm^{-3}$. The SCH can have many different thicknesses, with the preferred thickness being in the range of 0.07 to 0.15 μm. The preferred growth rate is in the range of 0.5 to 2 A/s to make the top surface of the SCH smooth and the preferred growth carrier gas is nitrogen with 100% $N_2$ subflow. By keeping the SCH 22 top surface smooth, subsequent layers can be grown with better quality. For example, the active region can be grown with layers having more uniform thickness such that the active region can emit light with a more uniform wavelength.

A thin undoped GaN layer 24 can be included on the n-type SCH, before growth of the multiple quantum well (MQW) active region. By having an undoped intrinsic material adjacent to the MQW active region, dopants are inhibited from flowing into the active region absent a driving current. The preferred thickness of the undoped GaN layer 24 is between 5-12 nm. The desired growth rate is between 0.3 to 1.0 A/s to make the layers smooth and the preferred growth carrier gas is nitrogen with a 100% $N_2$ subflow.

Figure 5:
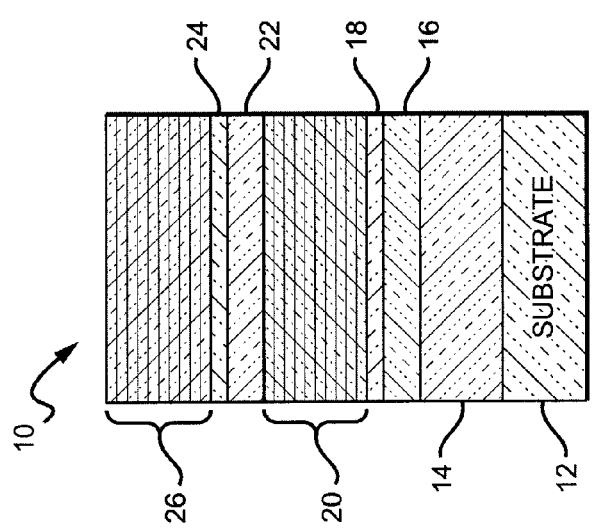
FIG. 5 is a sectional view of the laser diode in FIG. 4 with a multiple quantum well (MQW) active region on the undoped layer.

FIG. 5 shows the laser diode 10 with an active region 26 formed on the undoped GaN layer 24. The active region can comprise different layers arranged in different ways, with a preferred active region comprising a MQW region that can have different numbers of quantum wells and barrier layers. The preferred MQW region having three quantum wells. Quantum wells are included for confinement of electrons and holes to encourage recombination and the resulting light emission. In general, the larger the number of quantum wells within the MQW region typically results in increased gain volume. The greater the number of quantum wells in the MQW region also typically results in a higher necessary threshold voltage. Three quantum wells allows for a good combination of current density gain with a relatively low threshold voltage.

In one embodiment according to the present invention, MQW active region 26 comprises three quantum wells and associated barrier layers in an $In_xGa_{1-x}N/In_yGa_{1-y}N$ stack. The desirable composition of the quantum wells had (x) between 0.8 to 0.12 and that of the barrier layer has (y) between 0 to 0.04 for an approximate 405 nm emission wavelength. The desired well width is between 3-5 nm and the desired barrier width is between 4-8 nm. The preferred growth temperature is relatively low, between 800 to 950° C. to assist in In incorporation and is grown in nitrogen carrier gas with 100% $N_2$ subflow. The desired growth rate is slow, between 0.3 to 0.6 A/s, to make the interfaces smooth and to lower carbon incorporation into the active region. The preferred way of terminating the MQW region is by having a last well instead of a barrier.

Figure 6:
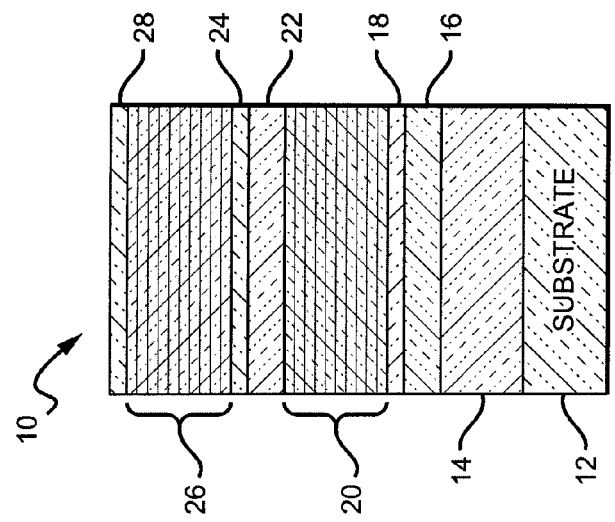
FIG. 6 is a sectional view of the laser diode in FIG. 5 with a blocking layer on the MQW active region.

FIG. 6 shows the laser diode 10 with an electron blocking layer 28 formed on the MQW active region 26. The blocking layer 28 comprises a material that blocks electrons from passing from the MOW active region 26 into the p-type SCH layer (shown in FIG. 7 and described below), but lets holes pass through to from the p-type SCH layer to the MQW active region 26. By blocking electrons, the blocking layer encourages recombination in the MQW active region 26.

The blocking layer 26 can be made of many different materials doped in different ways. A suitable material p-type $Al_xGa_{1-x}N$ achieved by Mg doping and a suitable thickness of the layer is between 15-25 nm. The preferable method of depositing the layer is by a two step deposition process. First, a 1-10 nm AlGaN layer is grown at lower temperature, preferably between 800 to 950° C. This low temperature growth helps reduce desorption and damage to the In in the MQW active region 26 that can be caused by higher temperatures. Second, the remaining blocking layer is grown at an elevated temperature, preferably between 900 to 1050° C. The preferred Al composition (x) of the blocking is between 0.15 to 0.25 and the desirable Mg doping concentration is between 7E18 and $3E19^{-3}$. The preferred growth carrier gas during deposition of the blocking layer 28 is nitrogen with a 100% $N_2$ subflow and the preferred growth rate is 1-2 A/s.

Figure 7:
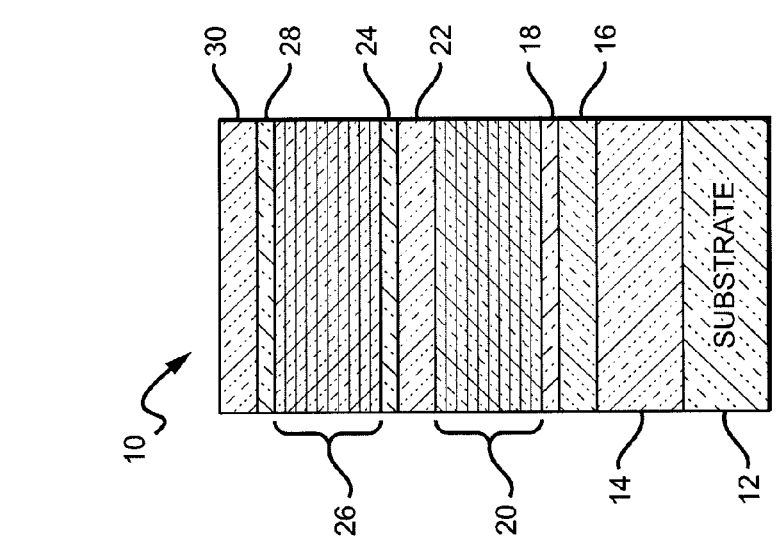
FIG. 7 is a sectional view of the laser diode in FIG. 6 with a SCH layer on the blocking layer.

FIG. 7 shows the laser diode 10 having p-type separate confinement heterostructure (SCH) layer 30 formed on the blocking layer 28. The p-type SCH 30 can be made of many different materials doped in many different ways, with a preferred p-type SCH 30 made of p-type GaN grown with Mg-doping. As described above, the p-type SCH layer 30, along with the n-type SCH layer 22, serves as the primary light path out of the laser diode 10 between the waveguiding elements. The preferred Mg doping density of the p-type SCH layer is between 1E18 to 5E19 $cm^{-3}$ and the preferred thickness range is between 0.07-0.15 μm. The preferred growth rate is between 1-2 A/s to make the layers smooth and the preferred carrier gas is hydrogen with a 50% $H_2$/50% $N_2$ subflow. The growth temperature for this layer is relatively high such as between 1000-1100° C. to assist uniform Mg diffusion in the p-AlGaN cap layer.

Figure 8:
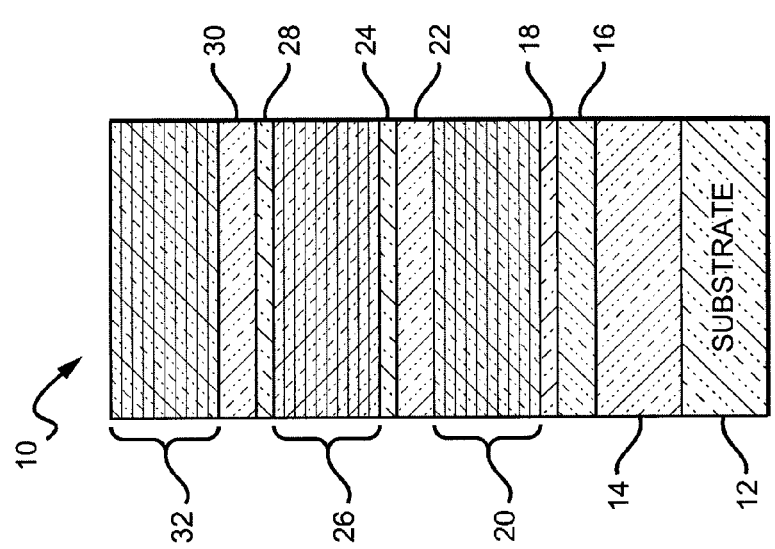
FIG. 8 is a sectional view of the laser diode in FIG. 7, with a SLS on the SCH layer.

FIG. 8 shows the laser diode 10 with a p-type SLS 32 grown on the p-type SCH layer 30. The p-type SLS 32 can be made of many different layers and materials arranged in different ways but is preferably p-type $Al_xGa_{1-x}N$/GaN:Mg modulation-doped SLS grown Mg acceptors (dopants) in the GaN layer only. The preferred thickness of the AlGaN and the GaN:Mg layer is between 2-3 nm and the preferred growth rate is between 0.5-1 A/s to assist Al incorporation at high pressure. The preferred growth carrier gas is hydrogen with a 50% $H_2$/50% $N_2$ subflow. Lower growth temperature between 850-950° C., can be utilized to reduce In segregation in the underlying active region 26 during the long p-type SLS growth step at high temperature. The desired acceptor density is between 8E18 to 5E19 $cm^{-3}$ the desirable Al composition (x) is between 0.15 and 0.2. Compositions (x) in the range 0.1-0.15 and 0.2 and 0.3 are also acceptable. Higher Al composition results in lower conductivity due to the increase in the ionization energy of the Mg dopant. Lower Al composition results in poor wave-guiding because of reduced difference in refractive-index between the active layer and the cladding layer. The preferred p-type SLS 32 thickness is between 0.6-1.5 μm. Thinner SLS can result in poor waveguiding and thicker SLS can result in cracking due to strain.

Figure 9:
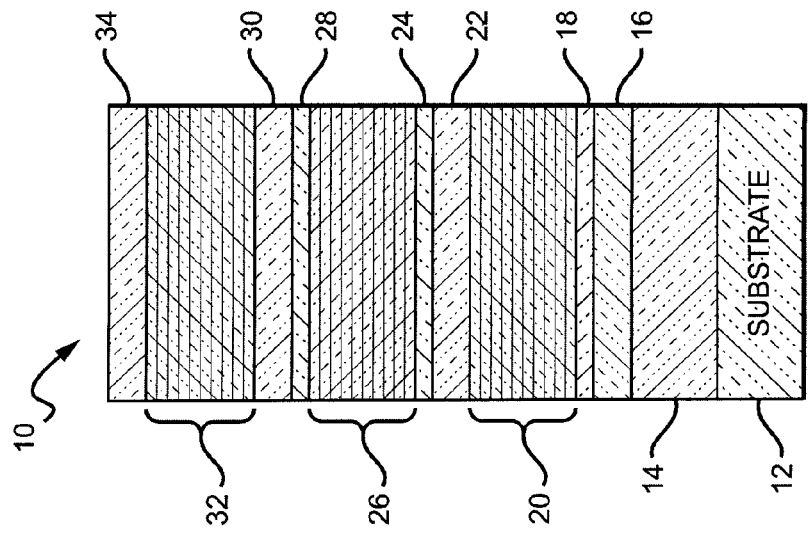
FIG. 9 is a sectional view of the laser diode in FIG. 8, with a contact layer on the SLS.

FIG. 9 shows the laser diode 10 capped with a thin p-type contact layer 32 that can be made of different materials doped in different ways, but is preferably p-type GaN by means of Mg-doping. The preferred doping density should be relatively high, with one embodiment having a doping density between 1E19 to 5E20 $cm^{-3}$. A doping ramp from low to high concentration can be utilized instead of a uniform doping concentration. In some embodiments a uniformly doped contact layer 32 that is heavily doped can be hazy, which can interfere with efficient operation. By ramping up the doping concentration such that the last portion of the contact layer 32 is highly doped, the contact layer typically will not turn haze. The preferred thickness range for the contact layer is between 20-50 nm and a suitable growth rate is between 0.5-2 A/s. The preferred carrier gas is hydrogen with a 50% $H_2$/50% $N_2$ subflow and the growth preferably is at relatively high temperature between 1000-1100° C.

The p-GaN cap layer 34 has relatively high doping and optimum thickness to allow for reduced threshold voltage. The higher the doping and the thinner the cap layer, the lower the Schottky barrier at the contact layer junction because of electron tunneling. The contact layer 34, however, cannot be too thin because the layer can then experience non-uniform doping. The contact layer 34 should have a sufficient thickness to allow for uniform layer doping. The p-type SLS structure 32 has lower doping (but high Al content) compared to the p-type cap layer 34, to reduce threshold voltage. With higher doping of the SLS structure, there is a danger that precipitants from the doping material (e.g. Mg) can form that can be resistive. This can result in higher operating threshold voltage. The lower doping, such as in the range described above, can provide good quality materials with no precipitates. This combination of highly doped and optimum thickness p-type cap layer 34 with lower doped p-type SLS structure 32, can provide reduced threshold voltage for laser diode 10.

Figure 10:
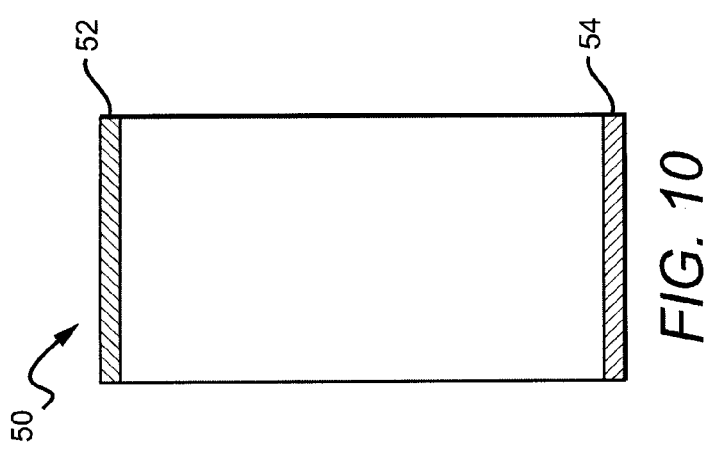
FIG. 10 is a sectional view of one embodiment of a laser diode according to the present invention with contacts.

FIG. 10 shows on embodiment of a laser diode 50 having features described above to provide for low threshold current and voltage operation. For ease of illustration the specific layers are not shown in detail, but it is understood that the layers can be arranged as those shown in FIGS. 1-9. The laser diode 50 further comprises a p-contact 52 on the top surface of the laser diode 30, which will typically be the p-type contact layer 34 shown in FIG. 9 and described above. The p-contact can comprise many different materials, but is preferably formed of combinations of nickel, gold and platinum (Ni/Au/Pt) deposited using know methods such as sputtering. The laser diode 50 further comprises an n-contact 54 on the substrate 12 that is shown in the FIGS. 1-9 and described above. For laser diode 50 the substrate is conductive, which allows re-contact to be formed directly on the substrate. The re-contact can also be made of many different materials with suitable materials being combinations of titanium and aluminum (Ti/Al). Current from the n-contact 54 flow through the substrate to the laser diode's active region. Pad metals can then be included on one or both of the p- and n-contacts 52, 54 and one or both can include an electrical connection, such as through a wire bond. In other embodiments, the n-contact can be directly connected to a submount such as a printed circuit board (PCB).

It is understood that the laser diode 50 can also operate without a substrate, with the substrate being removed following growth of the laser diode. In those embodiments without the substrate the n-contact can be on other layers such as the n-type contact layer shown as 14 in FIGS. 2-9 and described above, or on other layers.

Figure 11:
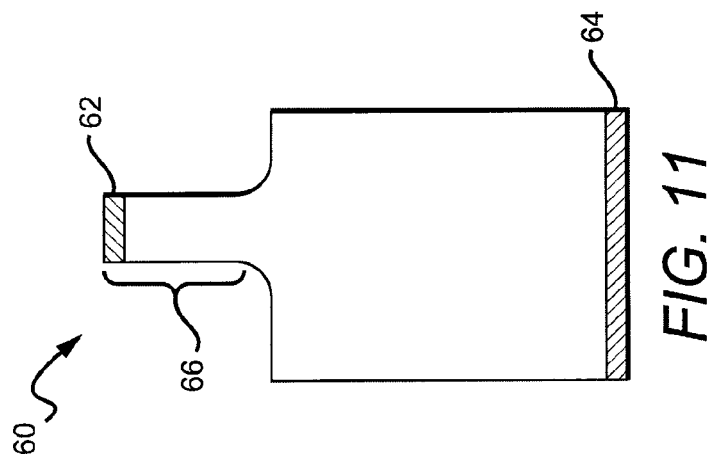
FIG. 11 is a sectional view of another embodiment of a laser diode according to the present invention with contacts.

FIG. 11 shows still another embodiment of a laser diode 60 according to the present invention with a p-contact 62 and n-contact 64. The upper portion of the laser diode 60 has been etched to form a ridge through the upper portion of the laser diode 60. The ridge is arranged to provide optical and electrical confinement during operation to increase efficiency. The p-contact is again on the top surface of the laser diode 60, which is also the top surface of the ridge 66 and is also the p-type contact layer 34 (FIG. 9). The laser diode 60 also has a conductive substrate that allows for the n-type contact to be formed on the substrate. The p- and n-type contacts 62, 64 can be made of the same material as contacts 52, 54 shown in FIG. 10 and described above, and pad metals can also be included on one or both of the contacts 62, 64. In other embodiments the n-contact can be contacted through a submount or PDB that the laser diode 60 is mounted to.

Figure 12:
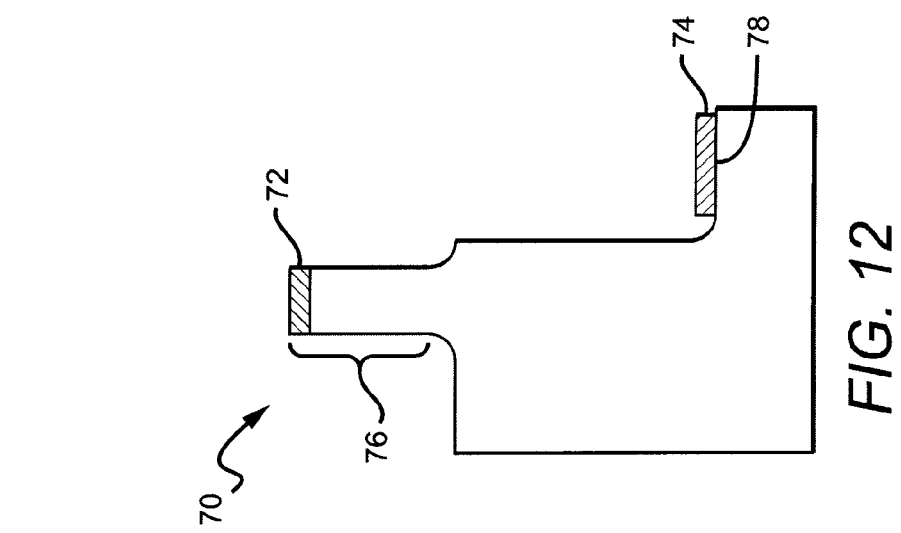
FIG. 12 is a sectional view of still another embodiment of a laser diode according to the present invention with contacts.

FIG. 12 shows a laser diode 70 also comprising a p-contact 72, n-contact 74 and a ridge 76, with the p-contact on the top surface of the ridge 76. For laser diode 70, however, the substrate is not conductive, and as a result the n-contact 74 cannot be formed on the substrate. Instead, a portion of the laser diode 70 is removed down to the n-type contact layer (element 14 described above and shown in FIGS. 2-9), such as by etching. A mesa 78 is formed in the n-contact layer for the n-contact 74. Current flows from the n-contact 74 through the n-contact layer and to the active region of the laser diode 70. The p- and n-type contacts can be made of the same material as those described above and can be deposited using the same methods. Pad metals can be included on one or both of the contacts 72, 74 and electrical connection can be made to both, such as through wire bonds.

Although the present invention has been described in considerable detail with reference to certain preferred configurations thereof, other versions are possible. Therefore, the spirit and scope of the appended claims should not be limited to their preferred versions contained therein.

We claim:
1. A method for fabricating a Group-III nitride laser diode, comprising:
    growing an n-type contact layer on a substrate at a temperature within a first growth temperature range;
    growing an n-type compliance layer on said n-type contact layer at a temperature within a second growth temperature range that is lower than said first growth temperature;
    growing a cap layer on said compliance layer at a temperature in said second temperature range to protect said compliance layer from temperatures in said first temperature range used to grow subsequent layers;
    growing an n-type waveguiding element and on said cap layer at a temperature within said first growth temperature range, said waveguiding element grown with a higher index of refraction compared to laser diodes without said compliance layer;
    growing an n-type separate confinement heterostructure (SCH) on said n-type waveguiding element;
    growing an active region on said n-type SCH;
    growing an undoped layer adjacent said active region on said n-type SCH;
    growing a p-type SCH on said active region; and
    growing a p-type waveguiding element on said p-type SCH.
2. The method of claim 1, wherein said active region comprises multiple quantum wells.
3. The method of claim 2, wherein said active region comprises three quantum wells.
4. The method of claim 1, further comprising growing a p-type contact layer on said p-type SLS at a temperature within said first temperature range.
5. A method for fabricating a Group-III nitride laser diode, comprising:
    growing an n-type contact layer on a substrate at a temperature within a first growth temperature range;
    growing an n-type compliance layer on said n-type contact layer at a temperature within a second growth temperature range that is lower than said first growth temperature;
    growing a cap layer on said compliance layer at a temperature in said second temperature range to protect said compliance layer from temperatures in said first temperature range used to grow subsequent layers;
    growing an n-type waveguiding element and on said cap layer at a temperature within said first growth temperature range, said waveguiding element grown with a higher index of refraction compared to laser diodes without said compliance layer;
    growing an n-type separate confinement heterostructure (SCH) on said n-type waveguiding element;
    growing an active region on said n-type SCH;
    growing a p-type SCH on said active region; and
    growing a p-type waveguiding element on said p-type SCH, wherein said n-type SCH, active region and p-type waveguiding element are grown at a temperature within said second growth temperature range, and said p-type SCH is grown at a temperature within said first temperature range.
6. The method of claim 1, wherein said first temperature range is from 1000 to 1100° C.
7. The method of claim 1, wherein said second temperature range is from 700 to 1000° C.
8. The method of claim 1, wherein said n-type contact layer comprises GaN grown at a rate in the range of 1.5 to 3 μm/hr and with a silicon doping density in the range of 1E17 to 1E19 cm$^{-3}$.
9. The method of claim 1, wherein said compliance layer comprises In$_x$Ga$_{1-x}$N wherein x is in the range of 0 to 0.20 and the Si doping density is in the range of 1E17 to 1E19 cm$^{-3}$.
10. The method of claim 1, wherein said n-type waveguiding element comprises an n-type Al$_x$Ga$_{1-x}$N/GaN strained layer superlattice (SLS).
11. The method of claim 10, wherein said n-type Al$_x$Ga$_{1-x}$N/GaN SLS has x in the range of 0.1 to 0.3 and wherein said GaN layers have a Si doping density in the range of 1E17 to 1E19 cm$^{-3}$.
12. The method of claim 1, wherein said n-type SCH comprises GaN grown at a rate in the range of 0.5 to 2 A/s with a Si doping density in the range of 1E17 to 1E18 cm$^{-3}$.
13. The method of claim 1, wherein said n-type SCH has a thickness in the range of 0.07 to 0.15 μm.
14. The method of claim 1, wherein said active region comprises an In$_x$Ga$_{1-x}$N/In$_y$Ga$_{1-y}$N multiple quantum well stack with x in the range of 0.8 to 0.12, and y in the range of 0 to 0.04, and a growth rate in the range of 0.3 to 0.6 A/s.
15. The method of claim 1, wherein said active region comprises three quantum wells with surrounding barrier layers, the width of each said quantum well in the range of 3-5 nm, and each barrier layer width in the range of 4-8 nm.
16. The method of claim 1, wherein said p-type SCH comprises GaN grown at a rate in the range of 1-2 A/s with a Mg doping density of 1E18 to 5E19 cm-3 and a thickness in the range of 0.07 to 0.15 μm.
17. The method of claim 1, wherein said p-type waveguiding element comprises a p-type Al$_x$Ga$_{1-x}$N/GaN strained layer superlattice (SLS) with x in the range of 0.1 to 0.3 and said GaN is Mg doped at a density in the range of 8E18 to 5E19 cm$^{-3}$.
18. The method of claim 17, wherein the growth rate of said p-type SLS is in the range of 0.5 to 1 A/s.
19. The method of claim 4, wherein said p-type contact layer comprises p-type GaN doped with a Mg doping density in the range of 1E19 to 5E20 cm$^{-3}$, grown at a rate in the range of 0.5 to 2 A/s to a thickness in the range of 20 to 50 nm.

20. The method of claim 4, wherein said p-type contact layer is grown with a ramp-up in doping density.

21. The method of claim 4, wherein said p-type contact layer is grown with a ramp-up in doping density.

22. The method of claim 1, further comprising growing a p-type electron blocking layer on said active region at prior to growing said p-type SCH.

23. The method of claim 22, wherein said blocking layer comprises p-type Al$_x$Ga$_{1-x}$N, where x is in the range of 0.15 to 0.25, having an Mg doping in the range of 7E18 to 3E19 cm$^{-3}$ and a thickness in the range of 15-25 nm.

24. A method for fabricating a Group-III nitride laser diode, comprising:
  growing an n-type contact layer on a substrate at a temperature within a first growth temperature range;
  growing an n-type compliance layer on said n-type contact layer at a temperature within a second growth temperature range that is lower than said first growth temperature;
  growing a cap layer on said compliance layer at a temperature in said second temperature range to protect said compliance layer from temperatures in said first temperature range used to grow subsequent layers;
  growing an n-type waveguiding element and on said cap layer at a temperature within said first growth temperature range, said waveguiding element grown with a higher index of refraction compared to laser diodes without said compliance layer;
  growing an n-type separate confinement heterostructure (SCH) on said n-type waveguiding element;
  growing an active region on said n-type SCH;
  growing a p-type SCH on said active region;
  growing a p-type waveguiding element on said p-type SCH; and
  growing a p-type electron blocking layer on said active region at prior to growing said p-type SCH, wherein the first 1-10 nm of said blocking layer is grown at a temperature within said second growth temperature range, and the remaining of said blocking layer is grown at a temperature within said first growth temperature range.

* * * * *